(12) United States Patent
Lee et al.

(10) Patent No.: US 7,365,025 B2
(45) Date of Patent: Apr. 29, 2008

(54) METHODS OF FORMING DUAL-DAMASCENE INTERCONNECT STRUCTURES ON SEMICONDUCTOR SUBSTRATES USING MULTIPLE PLANARIZATION LAYERS HAVING DIFFERENT POROSITY CHARACTERISTICS

(75) Inventors: Kyoung-Woo Lee, Fishkill, NY (US); Seung-Man Choi, Fishkill, NY (US); Ja-Hum Ku, Gyeonggi-do (KR); Ki-Chul Park, Fishkill, NY (US); Sun Oo Kim, Hopewell Junction, NY (US)

(73) Assignees: Samsung Electronics Co., Ltd. (KR); Infineon Technologies AG (DE)

( * ) Notice: Subject to any disclaimer, the term of this patent is extended or adjusted under 35 U.S.C. 154(b) by 24 days.

(21) Appl. No.: 11/348,428

(22) Filed: Feb. 6, 2006

(65) Prior Publication Data

US 2007/0184649 A1    Aug. 9, 2007

(51) Int. Cl.
*H01L 21/311* (2006.01)
(52) U.S. Cl. ........... 438/763; 257/758; 257/E21.627
(58) Field of Classification Search ............ 438/624, 438/960, 763
See application file for complete search history.

(56) References Cited

U.S. PATENT DOCUMENTS

| | | | |
|---|---|---|---|
| 6,720,252 B2 | 4/2004 | Chen et al. | |
| 6,720,256 B1 | 4/2004 | Wu et al. | |
| 6,743,713 B2 | 6/2004 | Mukherjee-Roy et al. | |
| 6,800,551 B2 | 10/2004 | Nagahara et al. | |
| 6,898,851 B2 | 5/2005 | Nishioka et al. | |
| 7,217,654 B2* | 5/2007 | Nagahara et al. | 438/637 |
| 2005/0014361 A1 | 1/2005 | Nguyen et al. | |
| 2005/0054183 A1* | 3/2005 | Park | 438/597 |
| 2005/0142859 A1 | 6/2005 | Lee | |
| 2005/0158987 A1 | 7/2005 | Choi | |

FOREIGN PATENT DOCUMENTS

| | | | |
|---|---|---|---|
| JP | 11154703 A | 6/1999 |
| JP | 2003167345 A | 6/2003 |
| JP | 2004253671 A | 9/2004 |

(Continued)

*Primary Examiner*—R. William Baumeister
*Assistant Examiner*—Emily Rohm
(74) *Attorney, Agent, or Firm*—Myers Bigel Sibley & Sajovec PA

(57) ABSTRACT

Methods of forming integrated circuit devices include patterning an electrically insulating layer to support dual-damascene interconnect structures therein. The steps of patterning the electrically insulating layer include using multiple planarization layers having different porosity characteristics. Forming an interconnect structure within an integrated circuit device may include forming an electrically insulating layer on a substrate and forming at least one via hole extending at least partially through the electrically insulating layer. The at least one via hole is filled with a first electrically insulating material having a first porosity. The filled at least one via hole is then covered with a second electrically insulating material layer having a second porosity lower than the first porosity. The second electrically insulating material layer is selectively etched back to expose a first portion of the first electrically insulating material in the at least one via hole. The electrically insulating layer is selectively etched to define a trench therein that exposes a second portion of the first electrically insulating material in the at least one via hole.

11 Claims, 3 Drawing Sheets

FOREIGN PATENT DOCUMENTS

| | | |
|---|---|---|
| JP | 2005197420 A | 7/2005 |
| KR | 1020020031300 A | 5/2002 |
| KR | 1020030094453 A | 12/2003 |
| KR | 1020040001473 A | 1/2004 |
| KR | 1020040041877 A | 5/2004 |
| KR | 1020040054140 A | 6/2004 |
| KR | 1020040055021 A | 6/2004 |
| KR | 1020040075668 A | 8/2004 |
| KR | 1020050009575 A | 1/2005 |
| KR | 1020050046428 | 5/2005 |
| KR | 1020050049003 | 5/2005 |
| KR | 1020050069583 | 7/2005 |
| KR | 1020050071024 | 7/2005 |
| KR | 10-0518895 | 9/2005 |

* cited by examiner

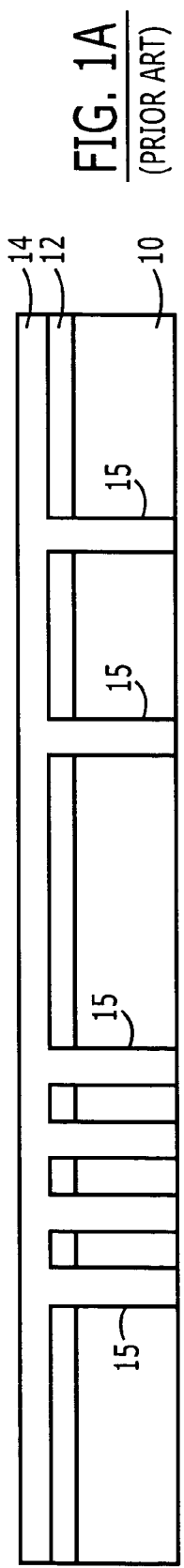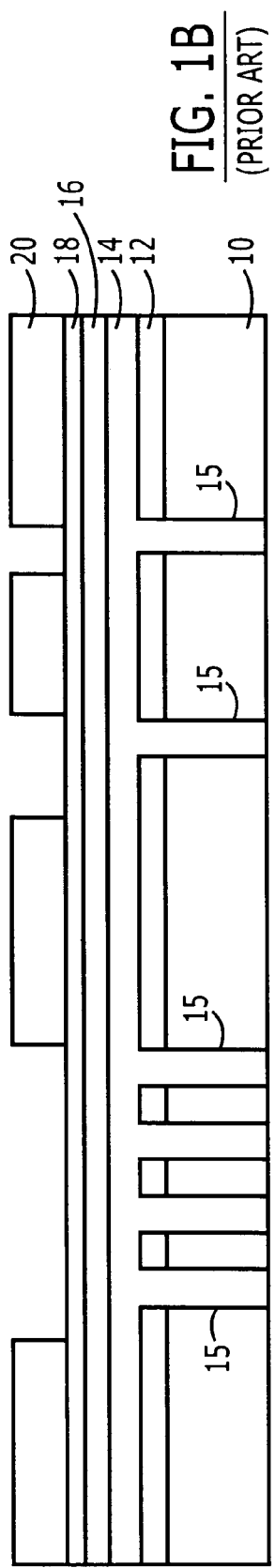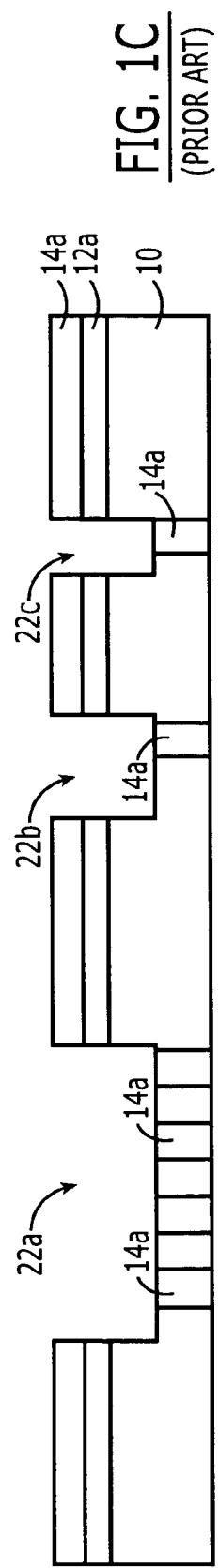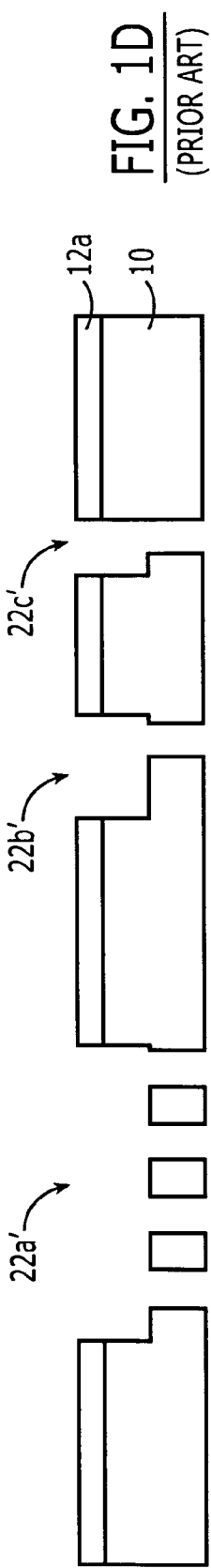
FIG. 1A (PRIOR ART)
FIG. 1B (PRIOR ART)
FIG. 1C (PRIOR ART)
FIG. 1D (PRIOR ART)

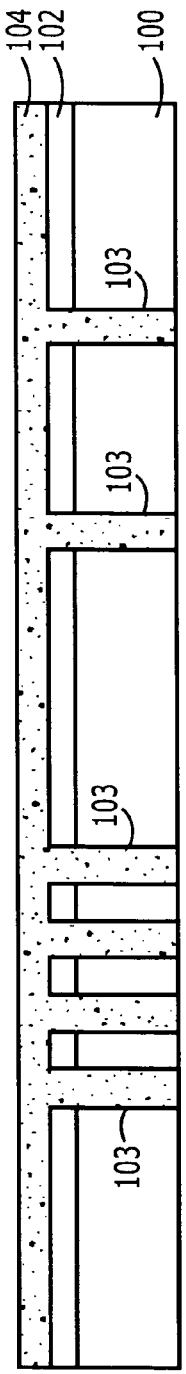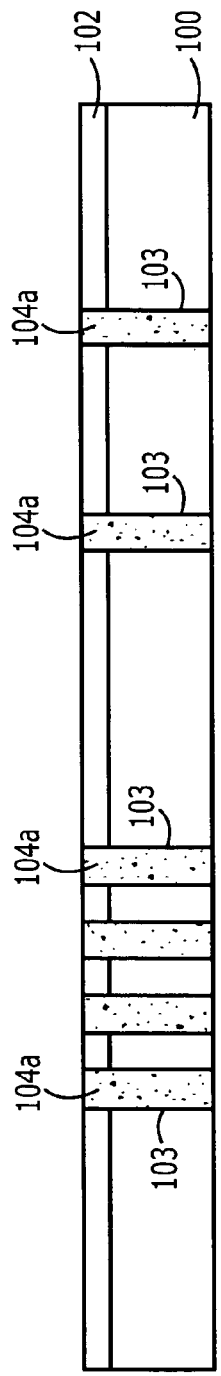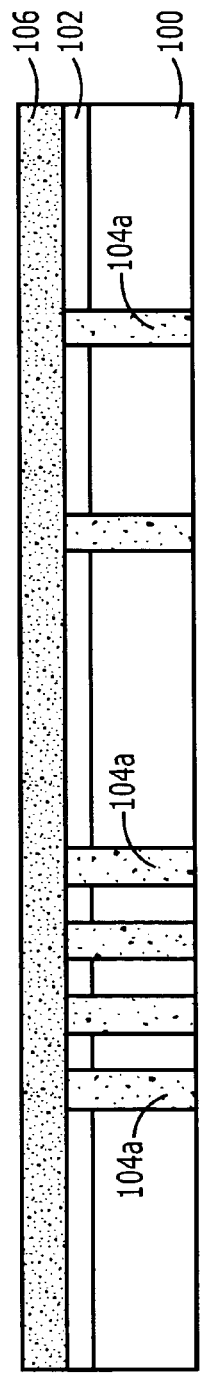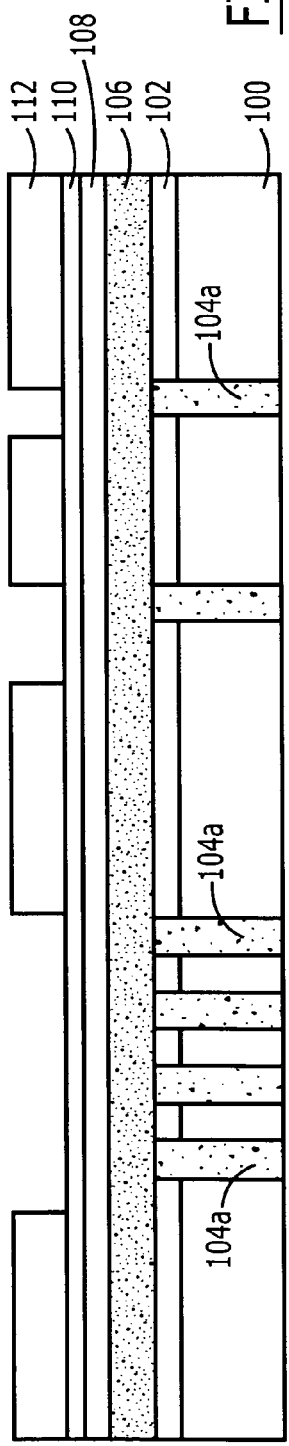

METHODS OF FORMING DUAL-DAMASCENE INTERCONNECT STRUCTURES ON SEMICONDUCTOR SUBSTRATES USING MULTIPLE PLANARIZATION LAYERS HAVING DIFFERENT POROSITY CHARACTERISTICS

FIELD OF THE INVENTION

The present invention relates to integrated circuit fabrication methods and, more particularly, to methods of fabricating integrated circuit devices having metal interconnect structures therein.

BACKGROUND OF THE INVENTION

Conventional methods of forming integrated circuit devices may include steps to form single and dual damascene structures using copper (Cu) as an electrical interconnect material. As illustrated by FIGS. 1A-1D, some of these conventional methods may include forming an electrically insulating layer 10 on an underlying integrated circuit substrate (not shown). This electrically insulating layer 10 may be a material having a low dielectric constant, which supports low capacitive coupling between adjacent conductive layers and patterns (not shown). The electrically insulating layer 10 may be a material such as porous SiCOH, which is treated as having an ultra-low dielectric constant (ULK) compared to other conventional insulating layers used in semiconductor processing. The electrically insulating layer 10 may be formed to have a thickness in a range from about 500 Å to about 20,000 Å. Thereafter, a hard mask layer 12 is formed on the electrically insulating layer 10. The hard mask layer 12 may be formed as a $SiO_2$ layer having a thickness in a range from about 50 Å to about 2,000 Å. The electrically insulating layer 10 and the hard mask layer 12 may be treated collectively as an inter-metal dielectric (IMD) layer. A selective etching step is then performed using a mask (not shown) to define a plurality of spaced apart vias 15 extending through the hard mask layer 12 and at least partially through the electrically insulating layer 10, as illustrated by FIG. 1A. A planarization layer 14 is then conformally deposited on the hard mask layer 12 and into the plurality of vias 15. This planarization layer 14 may be an organic planarization layer (OPL) formed of a material such as a hydrocarbon-based polymer, having a thickness in a range from about 500 Å to about 10,000 Å.

Referring now to FIG. 1B, a low temperature oxide (LTO) layer 16 having a thickness in a range from about 100 Å to about 2,000 Å is deposited on the planarization layer 14. An optional anti-reflective coating (ARC) 18 is then deposited on the LTO layer 16. The anti-reflective coating 18 may be formed of a hydrocarbon-based polymer material and may have a thickness in a range from about 100 Å to about 10,000 Å. A layer of photoresist material is then deposited and patterned to define a mask 20 having openings therein that expose the anti-reflective coating 18. Thereafter, as illustrated by FIG. 1C, a reactive ion etching (RIE) step(s) is performed to selectively and sequentially etch through the anti-reflective coating 18, the LTO layer 16, the planarization layer 14, the hard mask layer 12 and the electrically insulating layer 10 to thereby define a plurality of trenches 22a, 22b and 22c within the IMD layer. The mask 20, the anti-reflective coating 18 and the LTO layer 16 are also removed using multiple etching steps. Finally, as illustrated by FIG. 1D, remaining portions of the planarization layer 14a are removed from the hard mask layer 12a and the via holes to expose resulting interconnect trenches 22a', 22b' and 22c', which may be subsequently filled with an electrically conductive material (e.g., copper, not shown). This removal step is performed using an ashing step.

As will be understood by those skilled in the art, the planarization layer 14 operates to compensate for variations in underlying topology differences and thereby widen the process window for subsequent lithography steps. Moreover, the planarization layer 14 is typically formed of a material having relatively good RIE endurance, which enables the planarization layer 14 to operate as a good pattern transfer medium to pass the pattern of the mask 20 to the underlying IMD layer during etching. Unfortunately, in order to reduce ashing damage to the electrically insulating layer 10, a relatively mild ashing process may be required to remove remaining portions of the planarization layer 14a. However, the use of a relatively mild ashing process may result in the formation of planarization layer residues within the vias 15 after the ashing process is completed. Increasing the RIE endurance of the planarization layer 14 in response to decreasing its thickness to reduce RIE bias may also increase the likelihood of formation of planarization layer residues within the vias 15.

SUMMARY OF THE INVENTION

Methods of forming integrated circuit devices according to embodiments of the present invention include steps to form dual-damascene interconnect structures on semiconductor substrates. These steps include patterning an electrically insulating layer (e.g., an inter-metal dielectric (IMD) layer) to support dual-damascene interconnect structures therein. This interconnect structure may be formed of a metal such as copper (Cu). According to some of the embodiments of the invention, the steps of patterning the electrically insulating layer include using multiple planarization layers having different porosity characteristics. For example, forming an interconnect structure within an integrated circuit device may include forming an electrically insulating layer (e.g., IMD layer) on a substrate and forming at least one via hole extending at least partially through the electrically insulating layer. The at least one via hole is filled with a first electrically insulating material having a first porosity. The filled at least one via hole is then covered with a second electrically insulating material layer having a second porosity lower than the first porosity. In particular, a ratio of the first porosity to the second porosity is greater than about 2.0. The second electrically insulating material layer is selectively etched back to expose a first portion of the first electrically insulating material in the at least one via hole. Following this, the electrically insulating layer (e.g., IMD layer) is selectively etched to define a trench therein that exposes a second portion of the first electrically insulating material in the at least one via hole. The first electrically insulating material, which has a relatively high degree of porosity, is then removed from the at least one via hole. This removal step may be performed using a relatively mild ashing process because of the high porosity of the first electrically insulating material.

According to further aspects of these embodiments, the covering step is preceded by a step of etching back the first electrically insulating material by reactive ion etching (RIE) or chemical-mechanical polishing (CMP). In addition, the step of selectively etching back the second electrically insulating material layer includes selectively etching back the second electrically insulating material layer and a portion of the first electrically insulating material in sequence.

The step of selectively etching back the electrically insulating layer also includes selectively etching back the electrically insulating layer and the first electrically insulating material to define the trench. This selective etching step may include reactive ion etching (RIE) the electrically insulating layer and the first electrically insulating material in a selective manner using a mask to define the etching window.

According to still further aspects of these embodiments, the step of forming the at least one via hole is preceded by a step of depositing a hard mask layer on the electrically insulating layer. In this case, the covering step may be preceded by a step of etching back the first electrically insulating material by reactive ion etching (RIE) or chemical-mechanical polishing the first electrically insulating material for a sufficient duration to expose the hard mask layer. In addition, the step of selectively etching back the second electrically insulating material layer may include selectively etching back the second electrically insulating material layer for a sufficient duration to expose the hard mask layer.

BRIEF DESCRIPTION OF THE DRAWINGS

FIGS. 1A-1D are cross-sectional views of intermediate structures that illustrate conventional methods of patterning an electrically insulating layer to support dual-damascene interconnect structures.

FIGS. 2A-2G are cross-sectional views of intermediate structures that illustrate methods of patterning an electrically insulating layer to support dual-damascene interconnect structures, according to embodiments of the present invention.

DETAILED DESCRIPTION OF PREFERRED EMBODIMENTS

Figure 2E:
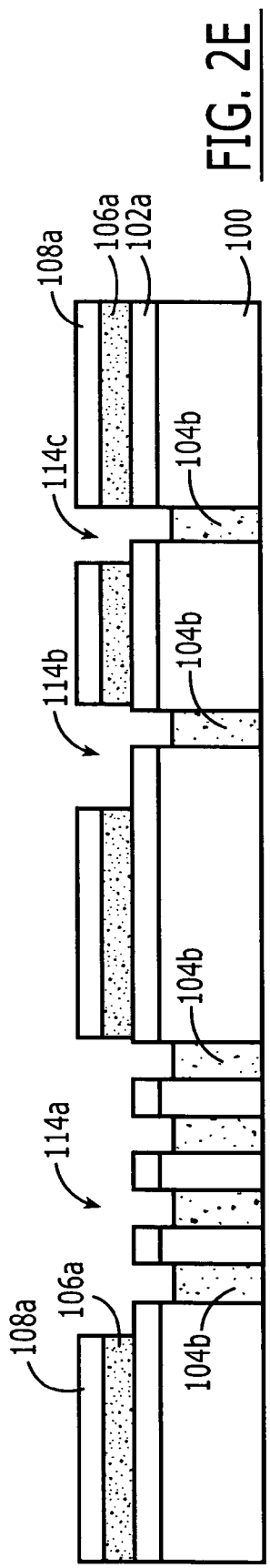

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

FIG. 2A illustrates the steps of forming an electrically insulating layer 100 on a substrate (not shown). This electrically insulating layer 100 may be formed as a porous SiCOH layer having a thickness in a range from about 500 Å to about 20,000 Å. In some embodiments of the invention, the electrically insulating layer 100 may be formed directly on an upper surface of the substrate and in other embodiments one or more intervening regions or layers may be present between the electrically insulating layer 100 and the substrate. A hard mask layer 102 may be formed on the electrically insulating layer 100 to define an inter-metal dielectric (IMD) layer as a composite layer (containing layers 100 and 102). This hard mask layer 102 may be formed as a $SiO_2$ layer having a thickness in a range from about 50 Å to about 2,000 Å. The hard mask layer 102 may be patterned using conventional techniques and a selective etching step may be performed to define a plurality of via holes 103 within the electrically insulating layer 100. These via holes 103 may extend partially through the electrically insulating layer 100 or, as illustrated by FIG. 2A, completely through the electrically insulating layer 100. A layer of a first electrically insulating material 104 having a first porosity (e.g., about 30% porosity) is then conformally deposited onto the hard mask layer 102 and into the plurality of via holes 103. This layer of a first electrically insulating material 104 may be a hydrocarbon-based polymer layer having a thickness in a range from about 500 Å to about 10,000 Å. As explained more fully hereinbelow, the porosity of the layer of first electrically insulating material 104 is sufficiently high so that it is highly susceptible to removal by etching (e.g., RIE etching), ashing or a chemical cleaning process during subsequent processing steps.

As illustrated by FIG. 2B, a planarization step is performed to remove portions of the layer of first electrically insulating material 104 from the hard mask layer 102. This planarization step is performed for a sufficient duration to expose the hard mask layer 102 and define a plurality of electrically insulating plugs 104a within the plurality of via holes 103. This planarization step may be performed by reactive ion etching (RIE) or chemically-mechanically polishing (CMP) the layer of first electrically insulating material 104. As illustrated by FIG. 2C, the upper portion of the layer of first electrically insulating material 104 removed by planarization is replaced by a second electrically insulating material layer 106 having a significantly lower second porosity than the layer of a first electrically insulating material 104. The second electrically insulating material layer 106 may be a hydrocarbon-based polymer layer having a thickness in a range from about 500 Å to about 10,000 Å. As explained more fully hereinbelow, the porosity of the second electrically insulating material layer 106 is sufficiently low so that it remains highly resistant to removal by etching (e.g., RIE etching) during subsequent processing steps. According to preferred aspects of these embodiments of the invention, a ratio of the first porosity to the second porosity is greater than about 2.0.

Referring now to FIG. 2D, a low temperature oxide (LTO) layer 108 having a thickness in a range from about 100 Å to about 2,000 Å is deposited on the second electrically insulating material layer 106. The step of forming an oxide layer 108 is followed by a step of forming an antireflective coating 110 on the oxide layer 108. This antireflective coating 110 may be a hydrocarbon-based polymer layer having a thickness in a range from about 100 Å to about 10,000 Å. A photolithography mask layer 112 is then deposited on the antireflective coating 110 and patterned using conventional techniques to define a trench mask. Thereafter, as illustrated by FIG. 2E, a step is performed to define openings 114a, 114b and 114c within the second electrically insulating material layer 106. This step of defining trenches may include performing reactive ion etching (RIE) to sequentially etch through the low temperature oxide layer 108 and the second electrically insulating material layer 106 and partially etch through the hard mask layer 102 (and define patterned layers 108a, 106a and 102a). This etching step will result in the exposure of the plurality of electrically insulating plugs 104a, which have a relatively high porosity and relatively high susceptibility to etching. Upon exposure to reactive ion etching (RIE), the electrically insulating plugs 104a may become recessed within the via holes 103 to define shorter plugs 104b. The mask layer 112 and the antireflective coating 110 are then removed using conventional techniques.

Figure 2F:
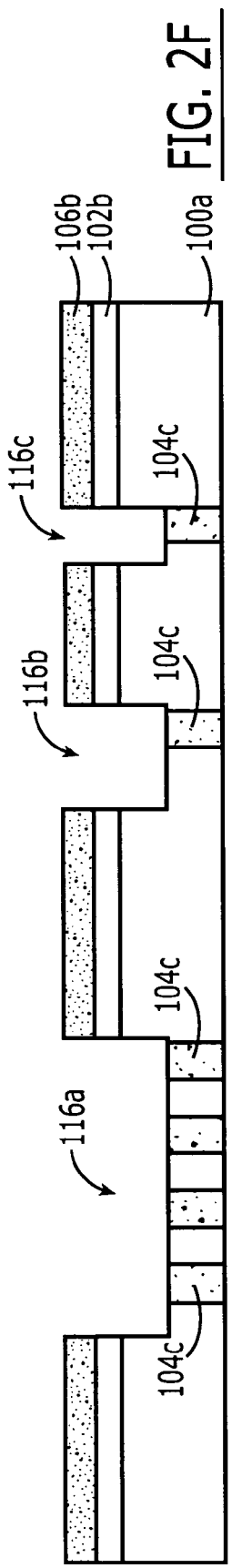
Figure 2G:
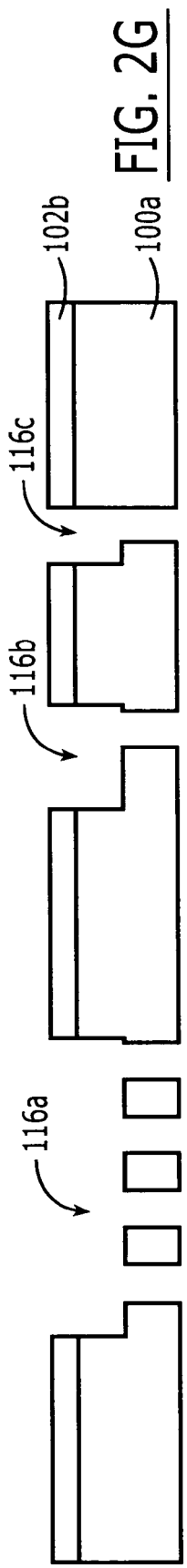

Referring now to FIG. 2F, the patterned second electrically insulating material layer 106a, which has a relatively high degree of resistance to reactive ion etching, is then used as a mask during an etching step(s) to remove portions of the hard mask layer 102a (now shown as 102b) and define trenches 116a, 116b and 116c within the electrically insulating layer 100a and plugs 104c within the via holes 103. This etching step(s) may also result in the removal of the patterned low temperature oxide layer 108a and thinning of the second electrically insulating material layer 106b. Finally, referring to FIG. 2G, a relatively mild ashing step may be performed to fully remove the relatively highly porous plugs 104c from within the original via holes 103, with reduced susceptibility to residue formation. Additional process steps (not shown) may be performed on the intermediate structure of FIG. 2G to define dual-damascene electrical interconnect structures (e.g., dual-damascene copper wiring patterns).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit device, comprising the steps of:
   forming an electrically insulating layer on a substrate;
   forming at least one via hole extending at least partially through the electrically insulating layer;
   filling the at least one via hole with a first electrically insulating material having a first porosity;
   covering the filled at least one via hole with a second electrically insulating material layer having a second porosity lower than the first porosity;
   selectively etching back the second electrically insulating material layer to expose a first portion of the first electrically insulating material in the at least one via hole;
   selectively etching back the electrically insulating layer, using the etched second electrically insulating material layer as an etching mask, to define a trench therein that exposes a second portion of the first electrically insulating material in the at least one via hole; and then
   removing the first electrically insulating material from the at least one via hole and the second electrically insulating material layer.

2. The method of claim 1, wherein said covering step is preceded by a step of etching back the first electrically insulating material by chemical-mechanical polishing.

3. The method of claim 1, wherein said covering step is preceded by a step of etching back the first electrically insulating material by reactive ion etching (RIE).

4. The method of claim 1, wherein said step of selectively etching back the second electrically insulating material layer comprises selectively etching back the second electrically insulating material layer and the first electrically insulating material in sequence; and wherein said step of selectively etching back the electrically insulating layer comprises selectively etching back the electrically insulating layer and the first electrically insulating material simultaneously to define the trench.

5. The method of claim 4, wherein said step of selectively etching back the electrically insulating layer comprises etching back the electrically insulating layer by reactive ion etching (RIE) the electrically insulating layer and the first electrically insulating material.

6. The method of claim 4, wherein said step of forming the at least one via hole is preceded by a step of depositing a hard mask layer on the electrically insulating layer.

7. The method of claim 6, wherein said covering step is preceded by a step of etching back the first electrically insulating material by chemical-mechanical polishing the first electrically insulating material for a sufficient duration to expose the hard mask layer.

8. The method of claim 7, wherein said step of selectively etching back the second electrically insulating material layer comprises selectively etching back the second electrically insulating material layer for a sufficient duration to expose the hard mask layer.

9. A method of forming an integrated circuit device, comprising the steps of:
   forming an intermetal dielectric (IMD) layer on a semiconductor substrate;
   forming a via hole extending through the IMD layer;
   forming a first electrically insulating material layer having a first porosity that extends on an upper surface of the IMD layer and fills the via hole;
   planarizing the first electrically insulating material layer for a sufficient duration to expose the IMD layer and define an electrically insulating plug having the first porosity in the via hole;
   depositing a second electrically insulating material layer having a second porosity lower than the first porosity that extends on the upper surface of the IMD layer and contacts the electrically insulating plug;
   selectively etching the second electrically insulating material layer and the electrically insulating plug for a sufficient duration to expose the upper surface of the IMD layer and define a recessed electrically insulating plug in the via hole;
   selectively etching back the IMD layer and the recessed electrically insulating plug, using the etched second electrically insulating material layer as an etching mask, to define a trench therein having a bottom that exposes a further recessed electrically insulating plug; and
   removing the further recessed electrically insulating plug from the via hole and the second electrically insulating material layer.

10. The method of claim 9, wherein removing the further recessed electrically insulating plug comprises removing the further recessed electrically insulating plug from the via hole using an ashing process.

11. The method of claim 9, wherein a ratio of the first porosity to the second porosity is greater than about 2.0.

* * * * *